United States Patent [19]
Davis

[11] 3,961,279
[45] June 1, 1976

[54] CMOS DIFFERENTIAL AMPLIFIER CIRCUIT UTILIZING A CMOS CURRENT SINKING TRANSISTOR WHICH TRACKS CMOS CURRENT SOURCING TRANSISTORS

[75] Inventor: Clark W. Davis, Saratoga, Calif.

[73] Assignee: National Semiconductor Corporation, Santa Clara, Calif.

[22] Filed: Jan. 29, 1975

[21] Appl. No.: 545,097

[52] U.S. Cl. ............................. 330/30 D; 330/22; 330/35
[51] Int. Cl.² ..................... H03F 3/16; H03F 3/45
[58] Field of Search ................ 330/22, 30 D, 35

[56] References Cited
UNITED STATES PATENTS

| | | | |
|---|---|---|---|
| 3,660,773 | 5/1972 | Free | 330/30 D |
| R27,351 | 5/1972 | McGraw et al. | 330/30 D |

Primary Examiner—R. V. Rolinec
Assistant Examiner—Lawrence J. Dahl
Attorney, Agent, or Firm—Lowhurst & Aine

[57] ABSTRACT

A control circuit comprising several CMOS transistors operating in cooperation with certain dimension relationships among the CMOS transistors to provide a first reference voltage to the gates of two current sourcing transistors and to provide a second reference voltage to the gate of a current sinking transistor, the two reference voltages being related, resulting in a desired tracking between the current sinking transistor and the two current sourcing transistors. The current sink transistor operates to current limit at a value which is approximately twice the current limiting value of either of the two current source transistors such that a substantial improvement in circuit performance is obtained.

18 Claims, 2 Drawing Figures

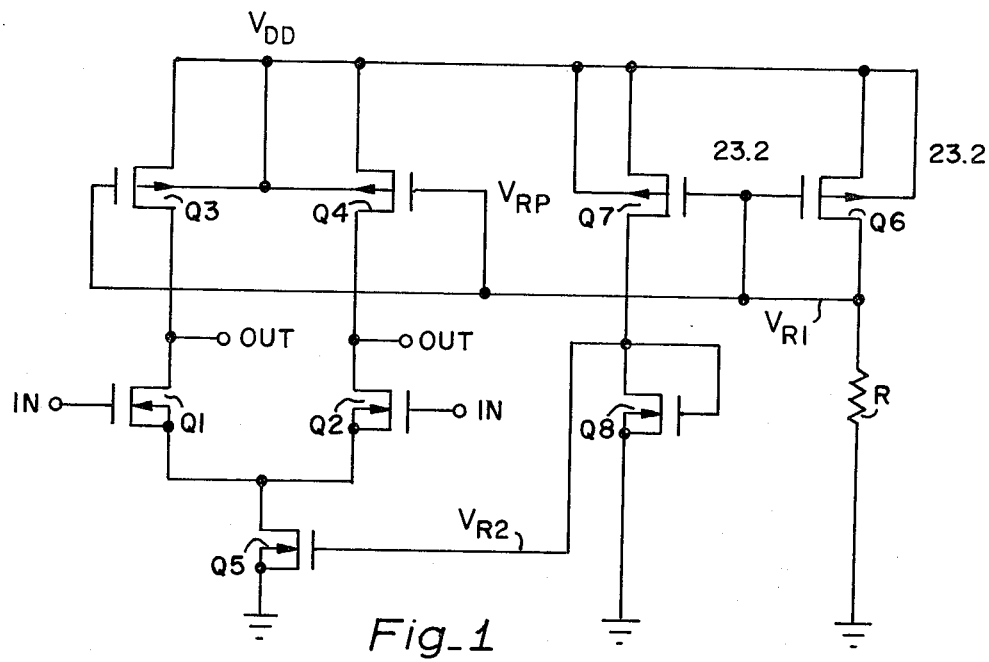
*Fig_1*
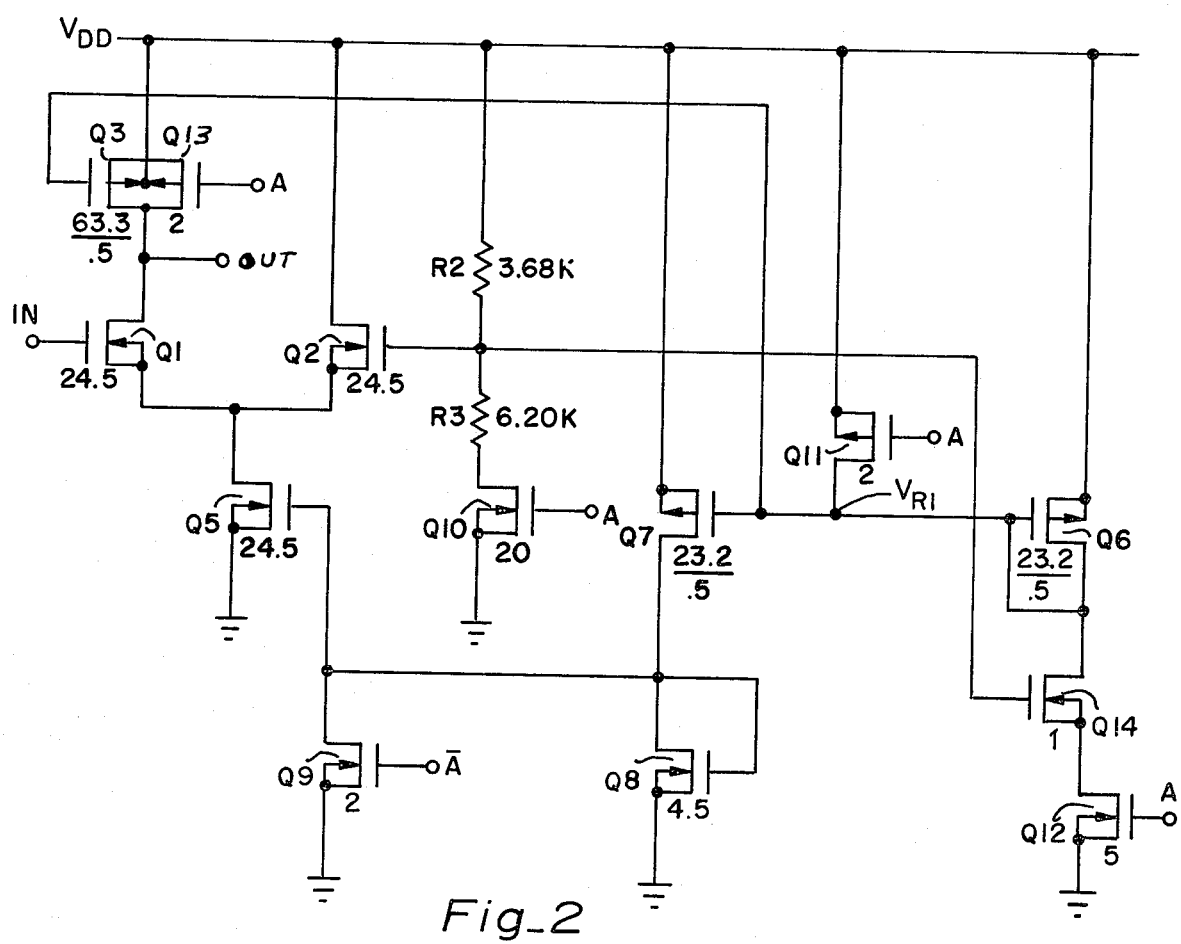
*Fig_2*

CMOS DIFFERENTIAL AMPLIFIER CIRCUIT UTILIZING A CMOS CURRENT SINKING TRANSISTOR WHICH TRACKS CMOS CURRENT SOURCING TRANSISTORS

BACKGROUND OF THE INVENTION

In a complementary metal oxide semiconductor (CMOS) Integrated circuit differential amplifier wherein two CMOS amplifier transistors are employed in the two branch circuits of the differential amplifier circuit, it is desired that the load circuit for each amplifier transistor be of very high impedance so that very large voltage changes at the output will result from small current changes. Such a high impedance load is obtained in each branch by utilizing CMOS transistors as current sources in the two branches of the amplifier to produce the desired high gain amplifier stage. A current source is desirable for the load in order to give high gain over a large range of output voltage. When utilizing current sourcing transistors in the two branches it is desirable to provide a current sinking or limiting CMOS transistor coupled in common to the two amplifier branches so that the current sink will manage as much current as is coming down through the two load circuits. This is necessary in order to be sure that the two amplifier transistors will be in their saturated region of operation when the two input voltages are equal and in order to maximize the common voltage range over which the circuit will operate. To accomplish this, it is desirable that the current sinking transistor be designed so as to match the current sourcing transistors so that the current sinking transistor will operate to manage about twice the maximum current expected from either of the two amplifier branches. In designing a typical form of CMOS differential amplifier, the current sources in the two branches coupled to the $V_{DD}$ voltage source are typically P channel devices whereas the current sinking CMOS transistor, with its source to drain circuit coupled to ground, is typically an N channel device. It is very difficult to fabricate N channel devices and P channel devices on a common semiconductor substrate so that the devices are matching. For example, characteristics that tend to make P channel transistors have a high gain in many cases result in N channel transistors having low gain. As the P channel threshold decreases, the N channel threshold increases and thus the P channel and N channel devices are working in opposition. As stated above, the N channel device can be over designed so that it operates satisfactorily with the two P channel devices, but this gives degraded performance.

BRIEF SUMMARY OF THE PRESENT INVENTION

In the present invention there is provided a control circuit comprising several CMOS transistors which operates in cooperation with certain dimension relationships among the CMOS transistors to provide a first reference voltage to the gates of the two current sourcing transistors and to provide a second reference voltage to the gate of the current sinking transistor, the two reference voltages being related, resulting in a desired tracking between the current sinking transistor and the two current sourcing transistors. The current sink transistor operates to current limit at a value which is approximately twice the current limiting value of either of the two current source transistors. Since the sinking current limiter limits at approximately twice the limit value of the current sources, rather than at some much higher value, and since this relationship is maintained over wide power supply voltage variations, a substantial improvement in circuit performance is obtained.

The control circuit comprises a first CMOS control transistor with its source to drain circuit connected in series with a resistor circuit across the $V_{DD}$ power supply. The voltage developed at the node between the first control transistor and the resistor is utilized to provide the first reference voltage to the gates of the two sourcing transistors. A second circuit is provided in the control circuit comprising second and third CMOS control transistors with their source to drain circuits connected in series across the $V_{DD}$ supply. The first reference voltage is used as the gate drive for the second control transistor and the second reference voltage is taken from the node between the second and third control transistors and utilized as the gate drive for the current sinking transistor. Certain of the CMOS transistors are so dimensioned, for example their channel widths are so ratioed, that the current sink transistor tracks the current sourcing transistors and current limits at approximately twice the limit value of one of the two current sourcing transistors.

In one embodiment the channel lengths of the current sourcing transistors and the first and second control transistors are made equal and the channel lengths of the current sinking transistor and the third control transistor are made equal, and the channel widths of these CMOS transistors are dimensioned so that the product of the channel widths of the current sinking transistor and the second control transistor is equal to about twice the product of the channel widths of the current sourcing transistor and the third control transistor.

In another illustration of the present invention, the dimensions of the two current sourcing transistors and the first control transistor are such that the current sourcing transistors limit at a current of $$\frac{W_{C.SOURCE}}{W_{F.C.}} \cdot \frac{V_{R1}}{R}$$

where the length of the channel regions of the two current sourcing transistors and the first control transistor are equal and where $W_{C.SOURCE}$ is the channel width for each of said current source transistors, $W_{F.C.}$ is the channel width for said first control transistor, $V_{R1}$ is the first reference voltage, and R is the value of the resistor, and the dimensions of the first, second and third control transistors and the current sinking transistor are such that the current sinking transistor limits at a current of $$\frac{W_{S.C.}}{W_{F.C.}} \cdot \frac{W_{C.SINK}}{W_{T.C.}} \cdot \frac{V_{R1}}{R}$$

when the lengths of the channel regions of the first and second control transistors are equal and the lengths of the channel regions of the third control transistor and the current sinking transistor are equal and where $W_{S.C.}$ is the channel width for the second control transistor, $W_{C.SINK}$ is the channel width for the current sinking transistor, and $W_{T.C.}$ is the channel width for the third control transistor.

BRIEF DESCRIPTION OF THE DRAWINGS

FIG. 1 is a schematic diagram of a CMOS integrated circuit illustrating a first embodiment of the present invention.

FIG. 2 is a schematic diagram of a CMOS integrated circuit illustrating a second embodiment of the present invention.

DESCRIPTION OF THE PREFERRED EMBODIMENTS

Referring now to FIG. 1 the CMOS differential amplifier circuit comprises a first CMOS amplifier transistor Q1 located in a first branch of the differential amplifier and a second CMOS amplifier transistor Q2 located in a second branch of the amplifier. A first CMOS current sourcing transistor Q3 is connected with its source to drain circuit in series with the first amplifier transistor Q1 in the first branch of the amplifier. A second CMOS current sourcing transistor Q4 is connected in series with the second amplifier transistor Q2 in the second amplifier branch. The two sources of the two amplifier transistor Q1 and Q2 are connected in common to a CMOS current sinking transistor Q5. In one typical illustrative form of CMOS differential amplifier, the two current sourcing transistors Q3 and Q4 are P channel devices whereas the two amplifier transistors Q1 and Q2 and the current sinking transistor Q5 are N channel devices. The sources of the two current sourcing transistors Q3 and Q4 are connected to the voltage potential source $V_{DD}$ and the drains and the drains of Q3 and Q4 connected to the drains of the two amplifier transistors Q1 and Q2. The sources of the two amplifier transistors Q1 and Q2 are coupled in common to the drain of the current sinking transistor Q5, the source of the current sinking transistor Q5 being coupled to ground. The inputs to the differential amplifier circuit are coupled to the gates of the two amplifier transistors Q1 and Q2 and the output may be taken from either or both of the drain circuits of the two amplifier transistors.

The two current source transistors Q3 and Q4 are utilized as the load circuits for the two associated amplifier transistors Q1 and Q2 since they provide the desired high impedance loads to produce the desired high gain characteristics for the amplifier. Since these current sources are used in the two amplifier branches, the current sinking CMOS transistor Q5 is provided in the common sources of the amplifiers to sink the currents coming down both of the amplifier branches from the current source; it is sufficient that the current sink Q5 will handle up to twice the maximum current from either of the branches. Since the current sinking transistor Q5 is an N channel device whereas the current sourcing transistors Q4 and Q3 are P channel devices, the matching of the current sinking transistor Q5 with the two current sourcing transistors Q4 and Q3 by dimension design on the integrated circuit is very difficult.

A novel control circuit, together with a very simple dimensioning relationship between certain of the CMOS transistors, provides a gate drive reference voltage $V_{R1}$ to both of the current sourcing transistors Q3 and Q4 and a related gate drive reference voltage $V_{R2}$ to the current sinking transistor Q5 which produces a tracking between the current sink and the current sources so that the current sink transistor always current limits at about twice the maximum current limit of one of the current source transistors. The control circuit comprises a first CMOS P channel type control transistor Q6 which has its drain coupled to one side of a resistor R, the source to drain circuit of the first control transistor Q6 and the resistor R being coupled in series across $V_{DD}$ and ground. The drain of the first control transistor Q6 is also coupled to the gate thereof. A second circuit comprising the P channel CMOS second control transistor Q7 and the N channel CMOS third control transistor Q8 is connected across the $V_{DD}$ to ground voltage source. The drain of the second control transistor Q7 is connected to the drain of the third control transistor Q8. The gate of the second control transistor Q7 is coupled to the node between the first control transistor Q6 and the resistor R. The gate of the third control transistor Q8 is connected to the node between the drains of the second and third control transistors Q7 and Q8 and this node point is also connected to the gate of the current sinking transistor Q5. The node between the first control transistor Q6 and the resistor R is connected to the gates of the two current sourcing transistors Q3 and Q4.

In operation the first control transistor Q6 and the resistor R will establish a certain value of current through Q6 in this circuit. The first control transistor Q6 is operating in the saturated mode since its gate is tied to its drain. Current will flow from the first control transistor Q6 when the voltage on the drain is one P channel threshold below $V_{DD}$. The gate to source voltage of the first control transistor Q6 will seek a voltage value that is needed to produce the current demand by the resistor R and the circuit comprising transistor Q6 and resistor R thus provides a reference drive voltage $V_{R1}$ to the gates of the two current source transistors Q3 and Q4. For example, with the gate to source voltage going more positive, there is more current flow through the resistor R since the voltage across the resistor R increases; the result is that there would be less gate to source drive provided by the first reference voltage $V_{R1}$ to the two current sourcing transistors.

This same gate voltage $V_{R1}$ is applied to the gate of the second control transistor Q7 and, assuming that the transistor Q7 has the same physical geometry as transistor Q6, transistor Q7 is going to limit and go into saturation at the same current that is passing through transistor Q6. Transistor Q7 then acts as a sourcing current limited relative to the control transistor Q8 and sets up a gate to source voltage on transistor Q8 needed to sink the value of current equal to that current in the sourcing current limiter Q7. Now if the geometries of transistors Q3, Q4, Q6 and Q7 are equal, then the currents at which these four transistors limit will be the same since there is the same gate to source voltage on them all. A second reference voltage $V_{R2}$ is generated at the node of the drains of transistors Q7 and Q8 and, if this reference voltage $V_{R2}$ is fed into the gate of transistor Q5 and, if the channel width of transistor Q5 is made to be twice the channel width of transistor Q8, then transistor Q5 will current limit at exactly twice the current limit of transistor Q8 which is the same current limit as that for the current sourcing transistors Q3 and Q4. The two reference voltages $V_{R1}$ and $V_{R2}$ will track so that the value at which transistor Q5 will current limit will always be a constant ratio, namely two, to that current value at which the current sourcing transistors Q3 and Q4 will current limit.

Referring now to FIG. 2 there is shown a schematic diagram of a CMOS differential amplifier circuit actually fabricated and utilizing the teachings of the present invention. Those CMOS transistors which correspond in function to the CMOS transistors of FIG. 1 bear the same reference numerals. In this circuit, there is no current sourcing CMOS transistor Q4 provided in the second branch of the amplifier since the output of this simple circuit is taken off the drain of the N channel amplifier transistor Q1. The gate of the second amplifier transistor Q2 is provided with a reference voltage input from the voltage divider network comprising resistors R2 and R3. The reference voltage set up on the gate of the second amplifier transistor Q2 is 63% of the voltage $V_{DD}$ of the circuit since this particular differential amplifier is meant to work with an input taken from a series resistor and capacitor circuit charged up from $V_{DD}$ and it is desired that the switch over point for the circuit occur at one time constant of the RC circuit on the input. CMOS transistors Q9-Q12 are included in the circuitry simply to turn off the various transistors so that when the differential amplifier circuit is not used to sense and switch, the current in the circuit will be reduced to zero. These transistors are switched by voltages applied in the conventional manner at terminals labeled A and $\overline{A}$. The transistor Q13 is provided so that the output node of the amplifier transistor Q1 is pulled up to $V_{DD}$ as the initial starting state for the amplifier output. The resistance R in circuit with the first control transistor Q6 is made up of the two CMOS transistors Q12 and Q14.

The actual channel lengths and channel widths for the different transistors are shown in the numbers associated with each CMOS transistor. The number on the top is the channel width in mils and the number on the bottom is the channel length is mils. For example, transistor Q3 has a channel width of 63.3 mils and a channel length of 0.5 mils. Where no second number appears, the channel length is 0.35 mils. The current sourcing transistor Q3 limits at a current $$I_{Q3} = \frac{W_{Q3}}{W_{Q6}} \cdot \frac{V_{R1}}{R}$$

when the lengths of the channel regions of the current sourcing transistor Q3 and the first control transistor Q6 are equal and where $W_{Q3}$ is the channel width for the said current source transistor and where $W_{Q6}$ is the channel width for said first control transistor Q6 and R is the resistance of Q12 and Q14 in series. The current sinking transistor Q5 limits at a current $$I_{Q5} = \frac{W_{Q7} \cdot W_{Q5}}{W_{Q6} \cdot W_{Q8}} \cdot \frac{V_{R1}}{R}$$

when the lengths of the channel regions of the first and second control transistors Q6 and Q7 are equal and the lengths of the channel regions of the third control transistor Q8 and the current sinking transistor Q5 are equal and where $W_{Q7}$ is the channel width for the second control transistor Q7, $W_{Q5}$ is the channel width for the current sinking transistor Q5, and $W_{Q8}$ is the channel width for the third control transistor Q8.

That which is claimed:

1. A CMOS differential amplifier circuit including a first and second branch circuit, said amplifier circuit comprising:
   a first CMOS amplifier transistor a source, a drain and a gate, the source to drain circuit thereof being in said first branch circuit of said amplifier,
   a second CMOS amplifier transistor comprising a source, a drain, and a gate, the source to drain circuit thereof being in said second branch circuit of said amplifier parallel to said first branch circuit,
   a CMOS current sourcing transistor having a source, a drain, and a gate, the source to drain circuit thereof being coupled to the source to drain circuit of said first amplifier transistor in said first branch circuit,
   a CMOS current sinking transistor having a source, a drain, and a gate, the source to drain circuit thereof being coupled in common to the source to drain circuits of said two amplifier transistors,
   a source of electrical potential, said two branch circuits and the source to drain circuit of said current sinking transistor being coupled in series across said source of potential,
   and a CMOS control circuit for providing a first reference voltage to be applied to the gate of said current sourcing transistor and a second reference voltage to be applied to the gate of said current sinking transistor, said CMOS control circuit comprising;
   a first CMOS control transistor having a source, a drain, and a gate,
   a resistor circuit coupled in series with the source to drain circuit of said first control transistor across said source of potential, the gate of said first control transistor being coupled to the node of said resistor and said source to drain circuit of said first control transistor, the gate of said current sourcing transistor being coupled to said node whereby the voltage developed at said node is utilized as the first reference voltage to the gate of said current sourcing transistor,
   a second CMOS control transistor comprising a source, a drain, and a gate, the gate thereof being coupled to the node of said resistor and said source to drain circuit of said first control transistor whereby said first reference voltage is applied to the gate of said second control transistor,
   and a third CMOS control transistor having a source, a drain, and a gate, the source to drain circuit of said third control transistor being coupled in series with the source to drain circuit of said second control transistor across said source of potential, the gate of said third control transistor being coupled to the node of the source to drain circuits of said second control transistor and said third control transistor, the gate of said current sinking transistor being coupled to the node of said source to drain circuits of said second and third control transistors whereby the voltage developed at said node is utilized as the second reference voltage to the gate of said current sinking transistor,
   the ratios of the channel widths of said three control transistors, said current sourcing transistor, and said current sinking transistor being such that the value of the second reference voltage applied to the gate of the current sinking transistor produces a current limiting value therein which is about twice the current limiting value produced in said current sourcing transistor by said first reference voltage applied to the gate of said current sourcing transistor.

2. A CMOS differential amplifier circuit as claimed in claim 1 wherein the channel regions of said current sourcing transistor and said first and second control transistors are of one conductivity type and wherein the channel regions of said two amplifier transistors, said current sinking transistor, and said third control transistor are of a second conductivity type.

3. A CMOS differential amplifier circuit as claimed in claim 2 wherein said first conductivity type is P channel and said second conductivity type is N channel.

4. A CMOS differential amplifier circuit as claimed in claim 1 including a second CMOS current sourcing transistor having a source, a drain, and a gate, the source to drain circuit thereof being coupled to the source to drain circuit of said second amplifier transistor in said second branch circuit, the gate thereof being coupled to said node of said resistor and said source to drain circuit of said first control transistor, the length and width of the channel region of said second current sourcing transistor being substantially equal to the length and width, respectively, of the channel region of said first current sourcing transistor.

5. A CMOS differential amplifier circuit as claimed in claim 4 wherein the channel regions of said two current sourcing transistors and said first and second control transistors are of one conductivity type and wherein the channel regions of said two amplifier transistors, said current sinking transistor, and said third control transistor are of a second conductivity type.

6. A CMOS differential amplifier circuit as claimed in claim 5 wherein said first conductivity type is P channel and said second conductivity type is N channel.

7. A CMOS differential amplifier circuit including a first and a second branch circuit, said amplifier circuit comprising:
   a first CMOS amplifier transistor comprising a source, a drain and a gate, the source to drain circuit thereof being in said first branch circuit of said amplifier,
   a second CMOS amplifier transistor comprising a source, a drain, and a gate, the source to drain circuit thereof being in said second branch circuit of said amplifier parallel to said first branch circuit,
   a CMOS current sourcing transistor having a source, a drain, and a gate, the source to drain circuit thereof being coupled to the source to drain circuit of said first amplifier transistor in said first branch circuit,
   a CMOS current sinking transistor having a source, a drain, and a gate, the source to drain circuit thereof being coupled in common to the source to drain circuits of said two amplifier transistors,
   a source of electrical potential, said two branch circuits and the source to drain circuit of said current sinking transistor being coupled in series across said source of potential,
   and a CMOS control circuit for providing a first reference voltage to be applied to the gate of said current sourcing transistor and a second reference voltage to be applied to the gate of said current sinking transistor, said CMOS control circuit comprising:
      a first CMOS control transistor having a source, a drain, and a gate,
      a resistor circuit coupled in series with the source to drain circuit of said first control transistor across said source of potential, the gate of said first control transistor being coupled to the node of said resistor and said source to drain circuit of said first control transistor, the gate of said current sourcing transistor being coupled to the node of said resistor and said source to drain circuit of said first control transistor, the gate of said current sourcing transistor being coupled to said node whereby the voltage developed at said node is utilized as the first reference voltage to the gate of said current sourcing transistor,
      a second CMOS control transistor comprising a source, a drain, and a gate, the gate thereof being coupled to the node of said resistor and said source to drain circuit of said first control transistor whereby said first reference voltage is applied to the gate of said second control transistor,
      and a third CMOS control transistor having a source, a drain, and a gate, the source to drain circuit of said third control transistor being coupled in series with the source to drain circuit of said second control transistor across said source of potential, the gate of said third control transistor being coupled to the node of the source to drain circuits of said second control transistor and said third control transistor, the gate of said current sinking transistor being coupled to the node of said source to drain circuits of said second and third control transistors whereby the voltage developed at said node is utilized as the second reference voltage to the gate of said current sinking transistor,
      the CMOS transistors being so dimensioned that, with the channel lengths of said current sourcing transistor and said first and second control transistors being equal and with the channel lengths of said current sinking and said third control transistor being equal, the product of the channel widths of said current sinking transistor and said second control transistor is equal to about twice the product of the channel widths of said current sourcing transistor and said third control transistor.

8. A CMOS differential amplifier circuit as claimed in claim 7 wherein the channel region of said current sourcing transistor and said first and second control transistors are of one conductivity type and wherein the channel regions of said two amplifier transistors, said current sinking transistor, and said third control transistor are of a second conductivity type.

9. A CMOS differential amplifier circuit as claimed in claim 8 wherein said first conductivity type is P channel and said second conductivity type is N channel.

10. A CMOS differential amplifier circuit as claimed in claim 7 including a second CMOS current sourcing transistor having a source, a drain, and a gate, the source to drain circuit thereof being coupled to the source to drain circuit to said second amplifier transistor in said second branch circuit, the gate thereof being coupled to said node of said resistor and said source to drain circuit of said first control transistor, the length and width of the channel region of said second current sourcing transistor being substantially equal to the length and width, respectively, of the channel region of said first current sourcing transistor.

11. A CMOS differential amplifier circuit as claimed in claim 10 wherein the channel regions of said two current sourcing transistors and said first and second control transistors are of one conductivity type and wherein the channel regions of said two amplifier transistors, said current sinking transistor, and said third control transistor are of a second conductivity type.

12. A CMOS differential amplifier circuit as claimed in claim 11 wherein said first conductivity type is P channel and said second conductivity type is N channel.

13. A CMOS differential amplifier circuit including a first and second branch circuit, said amplifier circuit comprising:
  a first CMOS amplifier transistor comprising a source, a drain and a gate, the source to drain circuit thereof being in said first branch circuit of said amplifier,
  a second CMOS amplifier transistor comprising a source, a drain, and a gate, the source to drain circuit thereof being in said second branch circuit of said amplifier parallel to said first branch circuit,
  a CMOS current sourcing transistor having a source, a drain, and a gate, the source to drain circuit thereof being coupled to the source to drain circuit of said first amplifier transistor in said first branch circuit,
  a CMOS current sinking transistor having a source, a drain, and a gate, the source to drain circuit thereof being coupled in common to the source to drain circuits of said two amplifier transistors,
  a source of electrical potential, said two branch circuits and the source to drain circuit of said current sinking transistor being coupled in series across said source of potential,
  and a CMOS control circuit for providing a first reference voltage to be applied to the gate of said current sourcing transistor and a second reference voltage to be applied to the gate of said current sinking transistor, said CMOS control circuit comprising:
    a first CMOS control transistor having a source, a drain, and a gate,
    a resistor circuit coupled in series with the source to drain circuit of said first control transistor across said source of potential, the gate of said first control transistor being coupled to the node of said resistor and said source to drain circuit of said first control transistor, the gate of said current sourcing transistor being coupled to said node whereby the voltage developed at said node is utilized as the first reference voltage to the gate of said current sourcing transistor,
    a second CMOS control transistor comprising a source, a drain, and a gate, the gate thereof being coupled to the node of said resistor and said source to drain circuit of said first control transistor whereby said first reference voltage is applied to the gate of said second control transistor,
    and a third CMOS control transistor having a source, a drain, and a gate, the source to drain circuit of said third control transistor being coupled in series with the source to drain circuit of said second control transistor across said source of potential, the gate of said third control transistor being coupled to the node of the source to drain circuits of said second control transistor and said third control transistor, the gate of said current sinking transistor being coupled to the node of said source to drain circuits of said second and third control transistors whereby the voltage developed at said node is utilized as the second reference voltage to the gate of said current sinking transistor, the dimensions of the current sourcing transistor and the first control transistor being such that the current sourcing transistor limits at a current of $$\frac{W_{c.\ source}}{W_{F.C.}} \cdot \frac{V_{R1}}{R}$$

when the length of the channel regions of the current sourcing transistor and the first control transistor are equal and where $W_{c.\ source}$ is the channel width for the current source transistor, $W_{F.C.}$ is the channel width for said first control transistor, $V_{R1}$ is the first reference voltage, and R is the value of the resistor,
  and the dimensions of the first, second, and third control transistors and the current sinking transistor being such that the current sinking transistor limits at a current of $$\frac{W_{S.C.}}{W_{F.C.}} \cdot \frac{W_{C.SINK}}{W_{T.C.}} \cdot \frac{V_{R1}}{R}$$

when the lengths of the channel regions of the first and second control transistors are equal and the lengths of the channel regions of the third control transistor and the current sinking transistor are equal and where $W_{S.C.}$ is the channel width for the second control transistor, $W_{C.SINK}$ is the channel width for the current sinking transistor, and $W_{T.C.}$ is the channel width for the third control transistor.

14. A CMOS differential amplifier circuit as claimed in claim 13 wherein the channel region of said current sourcing transistor and said first and second control transistors are of one conductivity type and wherein the channel regions of said two amplifier transistors, said current sinking transistor, and said third control transistor are of a second conductivity type.

15. A CMOS differential amplifier circuit as claimed in claim 14 wherein said first conductivity type is P channel and said second conductivity type is N channel.

16. A CMOS differential amplifier circuit as claimed in claim 13 including a second CMOS current sourcing transistor having a source, a drain, and a gate, the source to drain circuit thereof being coupled to the source to drain circuit of said second amplifier transistor in said second branch circuit, the gate thereof being coupled to said node of said resistor and said source to drain circuit of said first control transistor, the length and width of the channel region of said second current sourcing transistor being substantially equal to the length and width, respectively, of the channel region of said first current sourcing transistor.

17. A CMOS differential amplifier circuit as claimed in claim 16 wherein the channel regions of said two current sourcing transistors and said first and second control transistors are of one conductivity type and wherein the channel regions of said two amplifier transistors, said current sinking transistor and said third control transistor are of a second conductivity type.

18. A CMOS differential amplifier circuit as claimed in claim 17 wherein said first conductivity type is P channel and said second conductivity type is N channel.

* * * * *